(12) United States Patent
Matsuo

(10) Patent No.: US 7,019,398 B2
(45) Date of Patent: Mar. 28, 2006

(54) SEMICONDUCTOR DEVICE

(75) Inventor: Mie Matsuo, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 42 days.

(21) Appl. No.: 10/457,350

(22) Filed: Jun. 10, 2003

(65) Prior Publication Data

US 2003/0230803 A1      Dec. 18, 2003

(30) Foreign Application Priority Data

Jun. 18, 2002      (JP)      ............................ 2002-176880

(51) Int. Cl.
*H01L 23/48*      (2006.01)
(52) U.S. Cl. ...................... 257/734; 257/784
(58) Field of Classification Search ................ 257/774, 257/784, 773, 701, 678, 692
See application file for complete search history.

(56) References Cited

U.S. PATENT DOCUMENTS

| | | | |
|---|---|---|---|
| 5,659,201 A * | 8/1997 | Wollesen | ..................... 257/758 |
| 6,522,021 B1 * | 2/2003 | Sakihama et al. | ........... 257/784 |
| 2001/0051426 A1 | 12/2001 | Pozder et al. | |

FOREIGN PATENT DOCUMENTS

| JP | 4-139894 A | 5/1992 |
|---|---|---|
| JP | 11-186320 | 7/1999 |
| JP | 11-317408 | 11/1999 |
| JP | 2001-015516 | 1/2001 |
| JP | 2001-15516 A | 1/2001 |
| JP | 2001-156070 | 6/2001 |
| JP | 2002-016065 | 1/2002 |

OTHER PUBLICATIONS

Notification of Reasons for Rejection: Japanese Patent Application No. 2002-176880 mailed Aug. 3, 2004.
Office Action from the Patent Office of the People's Republic of China, on Jan. 14, 2005, and an English translation thereof.

* cited by examiner

*Primary Examiner*—David Nelms
*Assistant Examiner*—Thinh T Nguyen
(74) *Attorney, Agent, or Firm*—Finnegan, Henderson, Farabow, Garrett & Dunner, L.L.P.

(57) ABSTRACT

Disclosed is a semiconductor device comprises a substrate, a wiring formed into a predetermined pattern above the substrate and provided with a pad portion for external connection, an interlayer insulating film formed above the substrate to cover the wiring and provided with a contact hole for a contact to a pad portion of the wiring, and a cap layer formed on the interlayer insulating film and electrically connected, via the contact hole formed in the interlayer insulating film, with the pad portion of the wiring, wherein one end portion of the cap layer is positioned at the contact hole and the cap layer is extended from the contact hole in a direction which is different from that of the pattern of the wiring.

9 Claims, 4 Drawing Sheets

SEMICONDUCTOR DEVICE

CROSS-REFERENCE TO RELATED APPLICATIONS

This application is based upon and claims the benefit of priority from the prior Japanese Patent Application No. 2002-176880, filed Jun. 18, 2002, the entire contents of which are incorporated herein by reference.

BACKGROUND OF THE INVENTION

1. Field of the Invention

This invention relates to a semiconductor device, and in particular, to a semiconductor device having Cu multi-layer wirings and an improved pad electrode structure for wire bonding.

2. Description of the Related Art

Conventionally, the pad electrode of an LSI having a Cu wiring is usually provided with an Al cap layer for protecting a Cu pad. The reason for this is that Cu has a lower corrosion and oxidation resistance, compared to Al. In particular, in a product where wire bonding is employed, since it is difficult to perform direct bonding to Cu, the Al cap layer is generally employed.

However, even if the Al cap layer is formed in this manner, it suffers from surface roughening or peeling due to the application of probing thereto, thereby raising various problems, such as the deterioration of the yield of wire bonding or the corrosion of wirings due to the exposure of a Cu pad. Further, depending on the kind of product, the probing may be performed a great number of times on the Al cap layer prior to the application of wire bonding thereto, thus making the aforementioned problem more conspicuous.

As explained above, even if the Al cap layer is formed on the surface of the Cu pad, as is conventionally practiced, there are still problems that, due to mechanical stress, caused by probing, for example, the yield of wire bonding deteriorates or the wiring is corroded.

With a view to solve the aforementioned problems, there has been proposed a structure as shown in cross-section in FIG. 1. Here, a Cu pad and an Al cap layer are not laminated, interposed with an insulating film (an interlayer film), thereby minimizing the effects of probing and wire bonding.

More specifically, as shown in FIG. 1, an interlayer insulating film 42 is formed on the substrate 40 having therein a Cu wiring 41 and a pad portion 41a of the Cu wiring 41 formed in advance. An Al cap layer 44 is formed on this insulating film 42. A plurality of contact holes 43 are formed in this interlayer insulating film 42 which is located over the pad portion 41a, and the Al cap layer 44 is electrically connected via these contact holes 43 with the Cu pad portion 41a. In this structure, since the insulating film 42 is disposed below the Al cap layer 44, it is now possible to inhibit the deterioration of the yield of wire bonding that may be caused by the surface roughening or peeling of the Al cap layer due to the probing, and also to inhibit the generation of corrosion of wiring due to the exposure of the Cu pad.

However, when a contact hole 43 is disposed below the opening of a pad, as shown in the structure of FIG. 1, the interlayer insulating film 42 is caused to isolate between the cap layer 44 and the wiring pad 41a. As a result, there is a problem that the insulating film 42 may be destroyed by mechanical stress caused by the aforementioned probing. Once this insulating film 42 is destroyed, there may be raised a possibility of also damaging the underlying Cu wiring 41.

BRIEF SUMMARY OF THE INVENTION

A semiconductor device according to one embodiment of the present invention comprises:

a substrate;

a wiring formed into a predetermined pattern above the substrate and provided with a pad portion for external connection;

an interlayer insulating film formed above the substrate to cover the wiring and provided with a contact hole for a contact to a pad portion of the wiring; and a cap layer formed on the interlayer insulating film and electrically connected, via the contact hole formed in the interlayer insulating film, with the pad portion of the wiring;

wherein the wiring and the cap layer are extended opposite to each other from the contact hole.

A semiconductor device according to another embodiment of the present invention comprising:

a substrate;

a wiring formed into a predetermined pattern above the substrate and provided with a pad portion for external connection;

an interlayer insulating film formed above the substrate to cover the wiring and provided with a contact hole for a contact to a pad portion of the wiring; and a cap layer formed on the interlayer insulating film and electrically connected, via the contact hole formed in the interlayer insulating film, with the pad portion of the wiring;

wherein one end portion of the cap layer is positioned at the contact hole and the cap layer is extended from the contact hole in a direction which is different from that of the pattern of the wiring.

A semiconductor device according to another embodiment of the present invention comprising:

a substrate;

an n-ply (n is an integer of 2 or more) wiring formed above the substrate, a couple of neighboring layers of the n-ply wiring being electrically connected, through a contact hole for wiring, with each other; and a cap layer electrically connected, via a contact hole for pad, with the wiring of an uppermost layer (n-th layer);

wherein the wiring of uppermost layer and the cap layer are extended opposite to each other from the contact hole for pad, and the layers disposed on an upper portion of the n-ply wiring are constructed such that an i-th layer (i≦n) and an (i−1)th layer are extended opposite to each other from the contact hole for wiring.

DETAILED DESCRIPTION OF THE INVENTION

Figure 1:
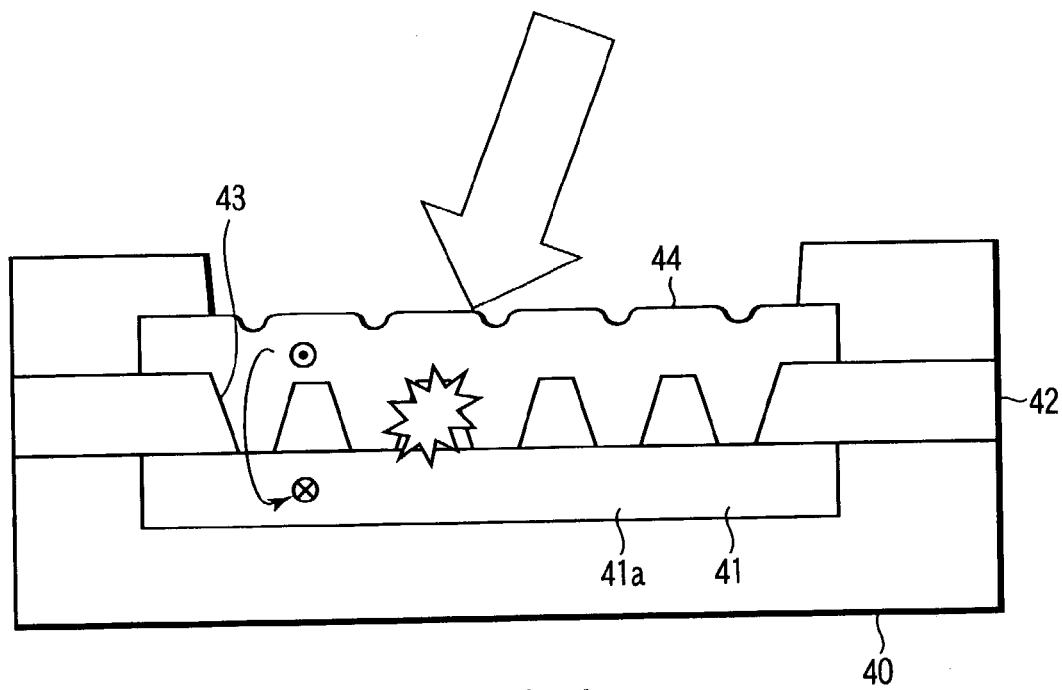
FIG. 1 is a cross-sectional view illustrating the structure of the pad electrode of a semiconductor device wherein an insulating film is interposed between a Cu pad portion and an Al cap layer.
Figure 2:
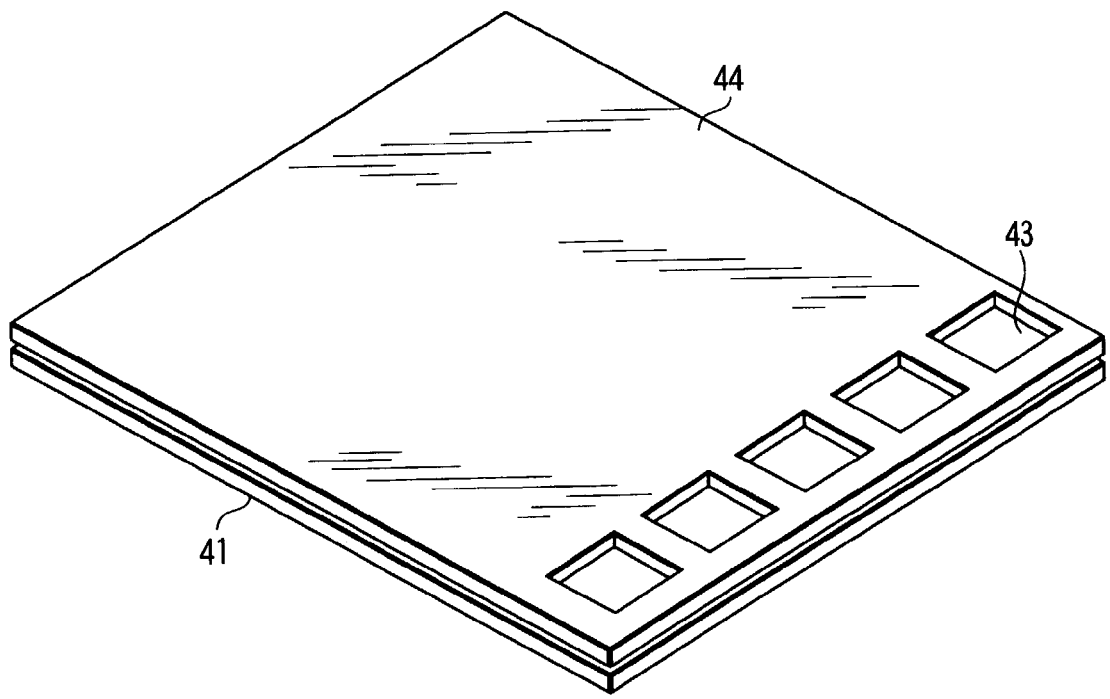
FIG. 2 is a perspective view showing the construction of the contact portion of the semiconductor device of FIG. 1.
Figure 3:
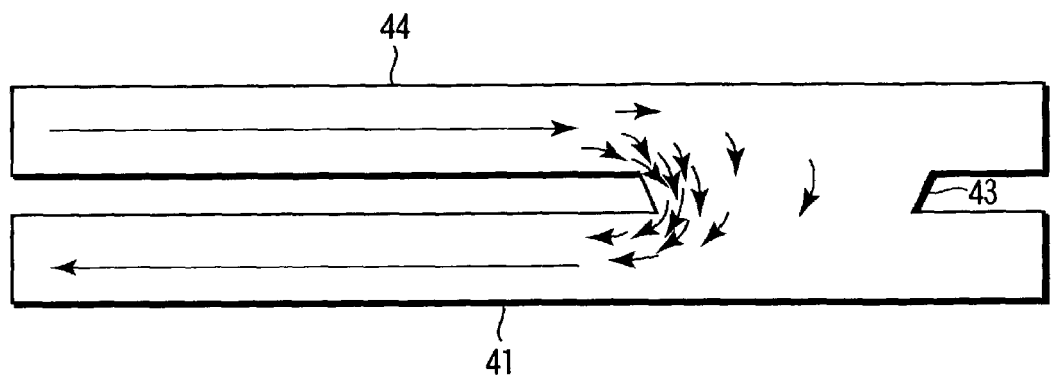
FIG. 3 is a diagram illustrating the state of current density of the contact portion of the semiconductor device of FIG. 1.

As a result of research conducted by the present inventor, it has been found that in the case of the structure shown in FIG. 1, in addition to the destruction of the insulating film, there is also a problem that a concentration of electric current may occur. FIGS. 2 and 3 illustrate the result where the distribution of current density is analyzed by using the finite-element method. Specifically, FIG. 2 shows a perspective view illustrating the arrangement model of the contact portion which was employed in the finite-element analysis. On the other hand, FIG. 3 shows a cross-sectional view schematically showing the distribution of electric current at one contact portion. As shown in FIG. 3, a concentration of electric current is caused to generate at one of the sidewalls of the contact portion, the maximum current density thereof being as high as 5.891 mA/$\mu$m$^2$.

Specifically, in the case of the structure as shown in FIG. 1, when the direction of the flow of electric current is taken into account, a concentration of electric current may be caused to occur at the inner sidewall portion of the contact, which is the shortest route, thereby raising a possibility of deteriorating the reliability of wiring due to the generation of electromigration.

On the other hand, according to the embodiments of the present invention, since the wiring and the cap layer are extended in the opposite direction to each other from a contact hole, the route of electric current of: the cap layer→the pad portion→the wiring at the contact portion can be permitted to disperse, thereby making it possible to alleviate the concentration of electric current at the sidewall portion of the contact hole. Further, since the wiring layer is not disposed below the cap layer excluding the contact hole portion, it is now possible to improve the resistance of the surface of contact to a mechanical destructive process, such as probing and wire bonding, thereby also making it possible to improve the reliability of the surface of contact to electromigration.

Next, the embodiments of the present invention will be explained in detail with reference to the drawings.

(First Embodiment)

Figure 4:
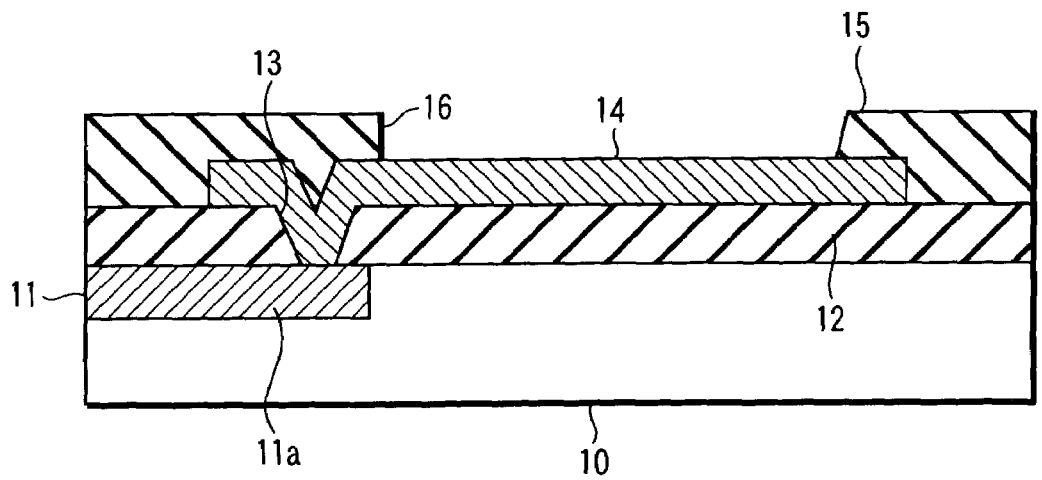
FIG. 4 is a cross-sectional view illustrating the structure of the pad electrode of a semiconductor device according to a first embodiment of the present invention.

FIG. 4 is a cross-sectional view illustrating the structure of the pad electrode of a semiconductor device according to a first embodiment of the present invention.

Referring to FIG. 4, the reference numeral 10 represents a semiconductor substrate provided thereon with various kinds of devices, such as an MOS transistor (not shown), as well as a wiring structure, wherein a Cu wiring 11 is buried in the surface region of the substrate 10. Further, the portion of the Cu wiring 11 that is designed to contact the cap layer is constituted by a Cu pad 11a, which is extended from the Cu wiring 11. Incidentally, the Cu wiring 11 is formed by so-called damascene process wherein a groove is formed at first in an insulating film deposited on the substrate, and then, Cu is buried inside this groove with a barrier metal being interposed as required, the resultant surface being subsequently polished to flatten the surface to form the Cu wiring 11.

An interlayer insulating film 12 formed of SiO$_2$, for instance, is deposited on the substrate 10 as well as on the wiring 11, and a contact hole 13 is formed at a portion of the interlayer insulating film 12. Herein, the contact hole 13 is provided at a location which coincides with the vicinity of the right end of the Cu pad portion 11a of the Cu wiring 11. Incidentally, the number of contact holes 13 is not necessarily limited to one but may be two or more, which may be arranged along the right end portion of the Cu pad portion 11a.

Inside the contact hole 13, as well as on the interlayer insulating film 12, there is disposed an Al bonding pad (cap layer) 14 covered with an Al—Cu (0.5 at %) layer containing a small quantity of Cu. This cap layer 14 is electrically connected, via the contact hole 13, with the Cu pad portion 11a. In this embodiment, the cap layer 14 is formed in such a manner that the contact hole 13 is positioned in the vicinity of the left end portion of the cap layer 14. Namely, the Cu wiring 11 and the cap layer 14 are extended in the opposite direction to each other from the contact hole 13.

Incidentally, the cap layer 14 is not constructed in a manner that the pad pattern portion for external connection is extended by a connecting wire, an extended end of which is electrically connected via the contact hole 13 with the wiring 11, but constructed in such a manner that the pad pattern portion of the cap layer 14 is directly connected via the contact hole 13 with the wiring pad portion 11a of the wiring 11 without employing the connecting wire. The reason for constructing the cap layer 14 in this manner is that if the pad pattern portion of the cap layer 14 is extended by a connecting wire, the concentration of electric current may occur at this narrow connecting wire formed in the cap layer 14.

On the Al cap layer 14 is deposited a passivation insulating film 15 which is made of SiN/SiO$_2$, the passivation insulating film 15 having a pad opening 16 for enabling wire bonding to be conducted to the Al cap layer 14. Further, a polyimide film (not shown) is deposited on this passivation insulating film 15.

Incidentally, although the film thickness of each of these layers and films can be optionally selected, the film thickness in this embodiment is set, for example, such that the Cu wiring 11 is 1 $\mu$m in thickness, the interlayer insulating film 12 is 0.5 $\mu$m in thickness, and the Al cap layer 14 is 1 $\mu$m in thickness. Further, although FIG. 4 illustrates only one pad electrode structure, there are of course formed a plurality of pad electrodes such as one for power supply, one for grounding, one for signal lines, etc. It is also possible to apply the construction of this embodiment to all of these pad electrodes or to apply the construction of this embodiment only to some of the pad electrodes where a large electric current is permitted to pass therethrough, such as the pad electrode for power supply and the pad electrode for grounding.

Figure 5:
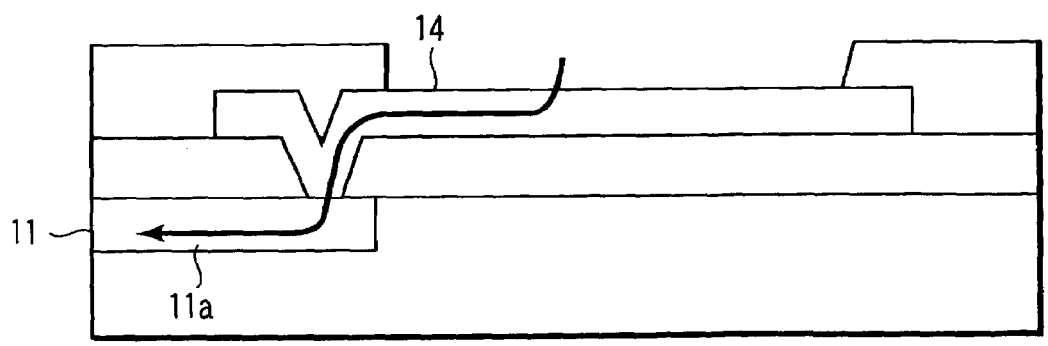
FIG. 5 is diagram illustrating the orientation of the flow of electric current in the semiconductor device of FIG. 4.

When the pad electrode is constructed in this manner, the electric current, supplied from the electrode (the Al cap layer 14) which is wire-bonded through the pad opening 16 and electrically connected with an external device, is permitted to flow, through the contact between the Al cap layer 14 and the Cu pad portion 11a, as indicated by the arrow shown in FIG. 5, to the Cu wiring 11. Namely, the electric current supplied from the Al cap layer 14 is always permitted to flow unidirectionally toward the main surface of the substrate 10, without generating a phenomenon where the direction of current flow in the upper side of the contact becomes opposite to that of the lower side thereof. Likewise, the direction of the electric current flowing from the Cu wiring 11 to the Al cap layer 14 is always permitted to flow unidirectionally toward the main surface of the substrate 10, without generating a phenomenon where the direction of current flow in the upper side of the contact becomes opposite to that of the lower side thereof.

Figure 6:
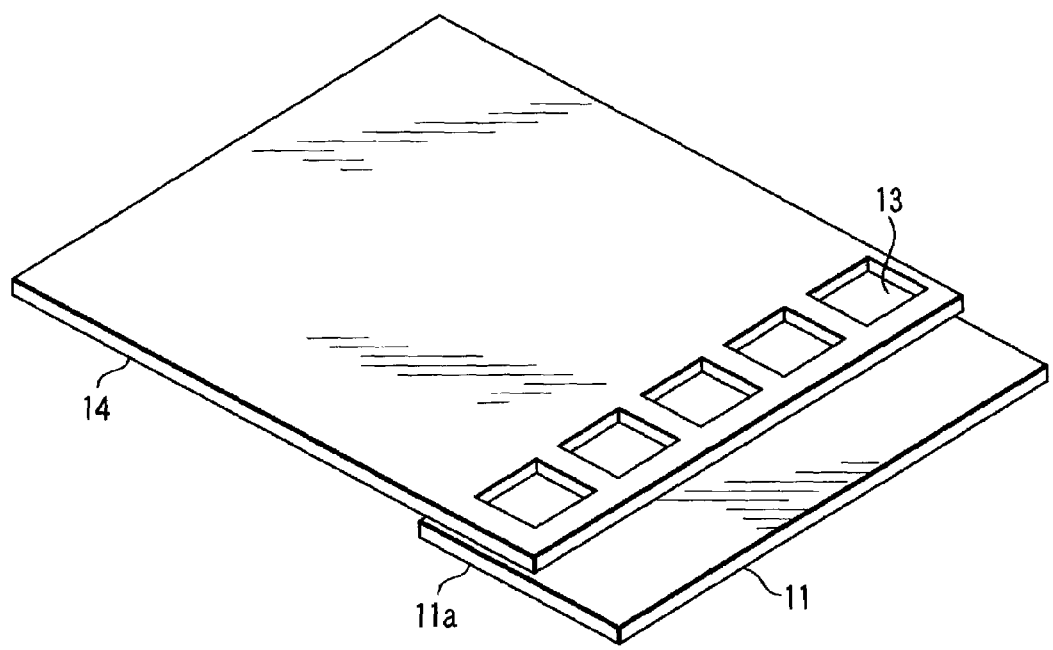
FIG. 6 is a perspective view illustrating the construction of the contact portion of a semiconductor device according to a first embodiment of the present invention.
Figure 7:
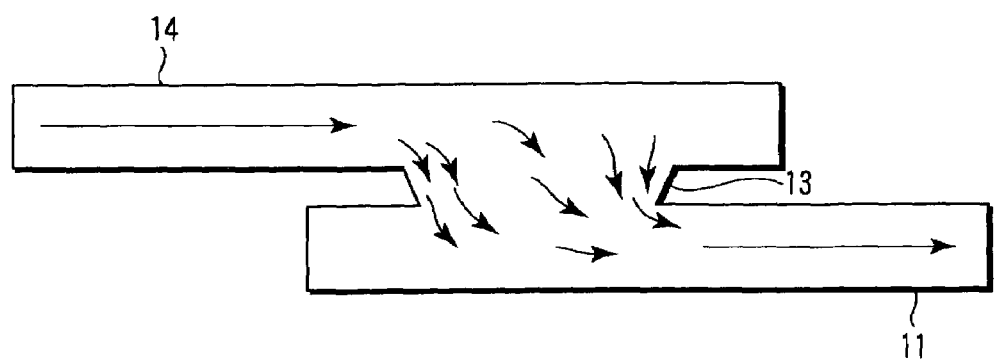
FIG. 7 is a diagram illustrating the state of current density of the contact portion of the semiconductor device according to a first embodiment of the present invention.

FIGS. 6 and 7 show the results where the distribution of current density is analyzed by using the finite-element method. Specifically, FIG. 6 shows a perspective view illustrating the arrangement model of the contact portion which was employed in the finite-element analysis. Specifically, one end portion of the Al cap layer 14 is superimposed on one end portion of the Cu pad portion 11a, and the Cu pad portion 11a is electrically connected through a plurality of contact holes 13 with the Al cap layer 14. On the other hand, FIG. 7 shows a cross-sectional view schematically showing the distribution of electric current at one of the contact portions shown in FIG. 6.

As shown in FIG. 7, the concentration of electric current at the sidewall portion of the contact is minimized as compared with that of FIG. 3, the maximum current density thereof being decreased to 3.039 mA/μm². Namely, as compared with the example shown in FIG. 3, the maximum current density in this embodiment was enabled to be reduced by about 48%. In other words, the current density that can be permitted to flow through one pad can be increased by 48%, thereby making it possible to apply this embodiment to a product of higher specification.

As explained above, according to the present embodiment, since the Cu wiring 11 and the cap layer 14 are extended in the opposite direction to each other from the contact hole 13, the direction of electric current of: the cap layer 14→the pad portion 11a→the wiring 11 is always unidirectionally orientated toward the main surface of the substrate 10. Likewise, the direction of electric current of: the wiring 11→the pad portion 11a→the cap layer 14 is also always unidirectionally orientated toward the main surface of the substrate 10. As a result, it is now possible to alleviate the concentration of electric current at the sidewall portion of the contact hole 13. Further, since there is no Cu wiring 11 disposed below the bonding portion of the cap layer 14, even if damage due to wire bonding occurs in the interlayer insulating film 12, there is little possibility of the wiring 11 being badly affected. Therefore, it is now possible to improve the reliability of the pad electrode structure.

(Second Embodiment)

Figure 8:
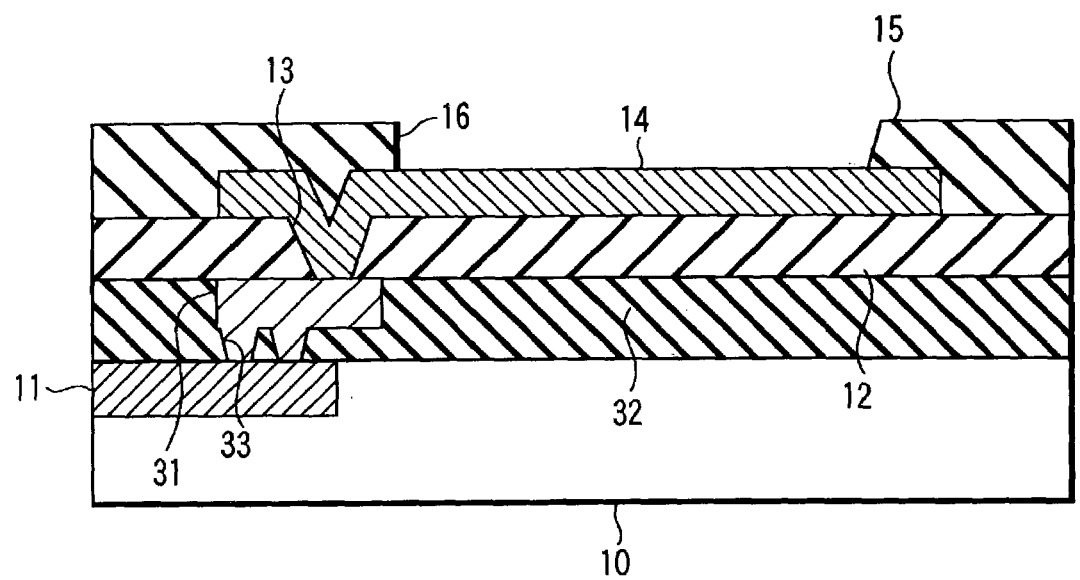
FIG. 8 is a cross-sectional view illustrating the structure of the pad electrode of a semiconductor device according to a second embodiment of the present invention.

FIG. 8 is a cross-sectional view illustrating the structure of the pad electrode of a semiconductor device according to a second embodiment of the present invention. Incidentally, the same portions as those of FIG. 4 are identified by the same reference numerals to omit the detailed explanation thereof.

In the first embodiment, it is constructed, for the purpose of alleviating the concentration of electric current at the contact portion of the Al cap layer where electromigration is more likely to be generated, such that the direction of electric current of: the Al cap layer→an uppermost Cu wiring, as well as the direction of electric current of: an uppermost Cu wiring→the Al cap layer are made unidirectional. Whereas, in this second embodiment, the direction of electric current of: the Al cap layer 14→an uppermost Cu wiring→a lower Cu wiring, as well as the direction of electric current of: a lower Cu wiring→an uppermost Cu wiring→the Al cap layer 14 are controlled to also alleviate the concentration of electric current at the contact portion between the Cu wiring layers. Namely, depending on the kinds of product or individual pad, the electric current that has been supplied from the bonding wire is supplied through the uppermost Cu wiring to a lower wiring without being substantially divided. In this case also, the upper Cu wiring and the lower Cu wiring are configured so as not to invite a phenomenon where the direction of current flow in the upper side of the contact becomes opposite to that of the lower side thereof.

More specifically, as shown in FIG. 8, a Cu wiring 11 is embedded on the substrate 10, and an interlayer insulating film 32 and a Cu wiring 31 are disposed thereon in a non-branched pattern. Incidentally, the Cu wiring 31 can be formed by damascene process as in the case of the Cu wiring 11. Further, it is desired to form a pattern where all of the electric current to be supplied through an Al bonding pad (cap layer) 14 from a corresponding boding wire is supplied to a lower Cu wiring 11, the pattern may be constructed such that the portions thereof which once divided are enabled to be re-united again. The Cu wirings 11 and 31 are electrically connected through the contact hole 33 formed in the interlayer insulating film 32. On the interlayer insulating film 32 and the Cu wiring 31, there is deposited an interlayer insulating film 12 formed of $SiO_2$ and a contact hole 13 is formed at a portion of this interlayer insulating film 12 as in the case of the aforementioned first embodiment.

In the same manner as shown in the first embodiment, a cap layer 14 is formed on the interlayer insulating film 12 and electrically connected via the contact hole 13 with the Cu wiring 31. A passivation insulating film 15 is deposited on the cap layer 14, and a pad opening 16 for enabling wire bonding to be performed to the cap layer 14 is formed in this passivation insulating film 15.

In this case, the contact hole 13 is formed in the vicinity of the right end portion of the Cu wiring 31, and the Al cap layer 14 is formed in such a manner that the left end portion thereof is positioned to coincide with the contact hole 13. Namely, the Cu wiring 31 and the Al cap layer 14 are extended in the opposite direction to each other from the contact hole 13. Further, a contact hole 33 is formed so as to coincide with the right end portion of the Cu wiring 11, and the Cu wiring 31 is formed in such a manner that the left end portion thereof coincides with the contact hole 33. Namely, the Cu wiring 11 and the Cu wiring 31 are extended in the opposite direction to each other from the contact hole 33.

Figure 9:
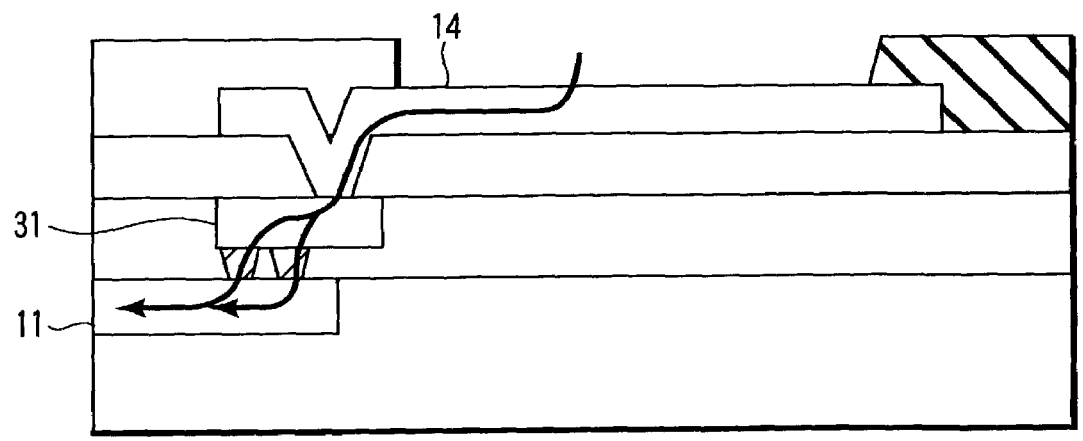
FIG. 9 is diagram illustrating the orientation of the flow of electric current in the semiconductor device of FIG. 8.

When the pad electrode is constructed in this manner, as shown in FIG. 9, the electric current flowing from the cap layer 14 to a lower wiring 11 would be directed leftward in the drawing in the case of: the cap layer 14→an uppermost Cu wiring 31, and even in the case of: an uppermost Cu wiring 31→a lower Cu wiring 11, the direction of the aforementioned electric current would become also leftward in the drawing. Namely, the direction of electric current is always permitted to flow unidirectionally toward the main surface of the substrate 10. Even in the cases of: a lower Cu wiring 11→an uppermost Cu wiring 31 and an uppermost Cu wiring 31→the cap layer 14, the direction of electric current becomes always unidirectional. Therefore, it is now possible to alleviate the concentration of electric current at the sidewalls of the contact holes 13 and 33.

Incidentally, when the uppermost Cu wiring 31 is formed of a pattern where it is bent at an intermediate portion between the upper contact hole 13 and the lower contact hole 33, the direction of electric current of the uppermost Cu wiring 31→the lower Cu wiring 11 and the lower Cu wiring 11→the uppermost wiring 31 would be of course set to a direction corresponding to the pattern of the uppermost Cu wiring 31.

In the same manner as in the case of the Cu wiring 31, even in the case of the Cu wiring 11 the electric current that has been supplied from the Cu wiring 31 may be permitted to flow as it is to a lower wiring (not shown) without being substantially divided through the Cu wiring 11. In that case also, the lower wiring can be configured so as to render the direction of current flow from the Cu wiring 11 to the lower wiring become leftward in the drawing. However, if the Cu wiring 11 is formed into a pattern where an intermediate portion thereof is divided so that the electric current supplied from the Cu wiring 31 is divided by the Cu wiring 11 and distributed to a plurality of lower wirings, there is no particular limitation with regard to the direction of electric current flowing through a plurality of these lower wirings from the Cu wiring 11.

Further, as shown in FIG. 8, since the wiring layers 11 and 31 are not disposed below the cap layer 14, even if damage due to wire bonding occurs in the interlayer insulating film 12, there is little possibility of the wiring layers 11 and 31 being badly affected. Therefore, it is now possible to obtain almost the same effects as in the case of the first embodiment. Further, when the structure set forth in this embodiment is applied to lower wirings where the electric current supplied thereto is not yet divided, it is possible to alleviate the concentration of electric current not only at the cap layer but also at the multi-layer wiring, thereby making it possible to further improve the reliability of the multi-layer wiring structure.

MODIFIED EXAMPLES

Incidentally, the present invention should not be construed as being limited to the aforementioned embodiments. For example, the material useful herein is not limited to the simply to Cu, and may be formed of a material containing Cu as a main component. Further, a material mainly containing Ag may be substituted for Cu. Further, as for the material for the cap layer, the material useful herein is not limited to the simply to Al, and may be formed of a material containing Al as a main component. Furthermore, the material for the cap layer is not limited to Al. Namely, the material for the cap layer may be constituted by any kind of materials, as long as it is higher in oxidation resistance and corrosion resistance as compared with the material constituting the wiring. The wiring may be an ordinary wiring which is formed on a main surface of the substrate and subsequently worked into a pattern.

Further, as shown in FIG. 4, although the cap layer is preferably formed in such a manner that one end thereof is positioned to coincide with a contact hole and the pattern thereof is extended from the contact hole in a direction opposite to the pattern of the wiring, the extending direction of the cap layer from the contact hole may not be opposite to but may be different from the pattern of the wiring. For example, even if the cap layer is configured to extend from the contact hole in a direction which is different from that of the pattern of the wiring by an angle of 90 degrees, the damage of wiring due to wire bonding can be avoided and the concentration of electric current is expected to be alleviated as compared with the conventional pad electrode structure.

Further, in the aforementioned second embodiment, although the wiring excluding the cap layer is formed of a 2-ply structure, it may be formed of not less than 3-ply structure. In that case, not all of the neighboring upper wiring and lower wiring in the multi-layer wiring are required to be extended in the opposite direction to each other from the contact hole, but the wirings of at least upper portions of the multi-layer wiring may be constructed to extend in the opposite direction to each other from the contact hole. For example, in a case where a second wiring is formed of a branched pattern in a 3-ply wiring structure, the second wiring and a third wiring should be constructed to extend in the opposite direction to each other from the contact hole in order to alleviate the concentration of electric current. However, with respect to the second wiring and a first wiring, their patterns may be optionally and freely designed, since the amount of electric current passing through these layers is already minimized.

The present invention can be variously modified within the spirit thereof.

As explained above in detail, according to the embodiments of the present invention, since the wiring and the cap layer are extended in the different direction to each other from a contact hole to be employed for electrically connecting a wiring pad with the cap layer, it is possible to prevent the deterioration of the wiring pad that may be caused by a mechanical stress such as probing and to alleviate the concentration of electric current flowing through the wirings, thereby making it possible to obtain a semiconductor device which is excellent in reliability as well as in performance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a substrate;
   an n-ply (n is an integer of 2 or more) wiring formed above said substrate, a pair of neighboring layers of said n-ply wiring being electrically connected, through a wiring contact hole, with each other; and
   a cap layer electrically connected, via a pad contact hole, with the wiring of an uppermost layer (n-th layer);
   wherein said wiring of the uppermost layer and said cap layer are extended opposite to each other from said pad contact hole, and the layers disposed on an upper portion of said n-ply wiring are constructed such that an i-th layer ($i \leq n$) and an (i−1)th layer are extended opposite to each other from said wiring contact hole.

2. The semiconductor device according to claim 1, wherein said cap layer is provided with a pad pattern to be electrically connected with an external device, said pad pattern being directly connected with a pad portion of said wiring of the uppermost layer without interposing a connecting wiring.

3. The semiconductor device according to claim 1, wherein the material of said cap layer differs from that of said wiring.

4. The semiconductor device according to claim 3, wherein the material of said cap layer is higher in oxidation resistance and in corrosion resistance than those of the material of said wiring.

5. The semiconductor device according to claim 3, wherein the material of said wiring is formed of a metal selected from the group consisting of Cu, Ag and a metal containing Cu or Ag as a main component.

6. The semiconductor device according to claim 3, wherein the material of said cap layer is formed of Al or a metal containing Al as a main component.

7. The semiconductor device according to claim 1, wherein said cap layer is provided with a bonding portion, and said wiring of the uppermost layer is formed below said cap layer in a predetermined region excluding where said bonding portion is formed.

8. The semiconductor device according to claim 1, wherein the i-th layer is constructed such that an electric current thereto is not divided.

9. The semiconductor device according to claim 8, wherein each of the wirings provided for the uppermost layer to (k+1)th layer (k+1≦i) is constructed such that an electric current supplied thereto is not divided, and the k-th layer is constructed such that an electric current supplied thereto is able to be divided.

* * * * *